(12) United States Patent
Young et al.

(10) Patent No.: US 8,581,212 B2
(45) Date of Patent: Nov. 12, 2013

(54) PORTABLE UV MONITORING DEVICE

(75) Inventors: Nigel David Young, Redhill (GB); Peter Fairley, Newton Ferrers (GB)

(73) Assignee: Chimei Innolux Corporation, Chu-Nan (TW)

( * ) Notice: Subject to any disclaimer, the term of this patent is extended or adjusted under 35 U.S.C. 154(b) by 696 days.

(21) Appl. No.: 12/645,242

(22) Filed: Dec. 22, 2009

(65) Prior Publication Data

US 2010/0187426 A1      Jul. 29, 2010

Related U.S. Application Data (60) Provisional application No. 61/205,782, filed on Jan. 23, 2009.

(51) Int. Cl.
*G01N 21/64* (2006.01)
(52) U.S. Cl.
USPC .................. 250/461.1; 250/372; 257/291
(58) Field of Classification Search
USPC ........... 250/580, 581, 461.1, 372, 458.1, 370; 257/290, 294, 291
See application file for complete search history.

(56) References Cited

U.S. PATENT DOCUMENTS

| | | | | |
|---|---|---|---|---|
| 2,114,163 A | * | 4/1938 | Bird .............................. | 250/368 |
| 4,775,514 A | * | 10/1988 | Barnikol et al. ........... | 422/82.08 |
| 6,300,638 B1 | * | 10/2001 | Groger et al. .............. | 250/458.1 |
| 6,713,795 B2 | * | 3/2004 | Kuhlmann ................... | 257/290 |
| 2003/0018353 A1 | * | 1/2003 | Yang et al. .................. | 606/194 |
| 2004/0155199 A1 | * | 8/2004 | Su et al. ...................... | 250/372 |
| 2007/0170366 A1 | * | 7/2007 | Lin et al. ..................... | 250/372 |
| 2009/0027319 A1 | * | 1/2009 | Chen ............................. | 345/87 |
| 2009/0123718 A1 | * | 5/2009 | Ogasawara et al. ........... | 428/215 |
| 2009/0129115 A1 | * | 5/2009 | Fine et al. .................... | 362/606 |
| 2009/0174647 A1 | * | 7/2009 | Chen et al. .................... | 345/102 |

FOREIGN PATENT DOCUMENTS

| CN | 101086566 | 12/2007 |
|---|---|---|
| CN | 201110786 | 9/2008 |

OTHER PUBLICATIONS

Cowens, et al., "Coronene and Liumogen as VUV Sensitive Coatings for Si CCD Imagers: a Comparison", Nov. 15, 1980, Applied Optics, vol. 19, No. 22, pp. 3727-3728.

Harrison et al., "Ultraviolet Radiation-Induced Erythema in Human Skin", Methods 28, (2002), pp. 14-19.

\* cited by examiner

*Primary Examiner* — David Porta
*Assistant Examiner* — Yara Green
(74) *Attorney, Agent, or Firm* — Liu & Liu (57) ABSTRACT

The monitoring of UV radiation has received increased attention recently due to the hazards of accelerated skin ageing and even cancer following excessive exposure. Personalized monitoring gives a more accurate reading than crude weather forecasts of the 'UV index'. This invention answers both these needs in a personal UV monitor that is incorporated into an existing display. Minimal processing changes are made to an existing display in order to achieve this added functionality, which is therefore achieved at little additional cost.

19 Claims, 13 Drawing Sheets

PORTABLE UV MONITORING DEVICE

CROSS REFERENCE TO RELATED APPLICATIONS

This application claims the benefit of U.S. Provisional Application No. 61/205,782, filed on Jan. 23, 2009, the entirety of which is incorporated by reference herein.

BACKGROUND OF THE INVENTION

1. Field of the Invention

The present invention relates to the device of monitoring UV, and in particular relates to the UV monitoring device integrated in the portable display device.

2. Description of the Related Art

The need for monitoring of the sun's UV radiation dose is well understood, in particular amongst those who sunbathe and who wish to minimize the risk of exceeding a healthy dose. Daily weather forecasts offer a crude UV index which gives a rough indication as to the likely 'burn time' of the average person in the sun, but since local exposure conditions are affected by effects such as cloud cover, this can only offer a very crude indication of the total dose. The monitoring of UV from sun exposure therefore requires a personal solution.

The spectral content of the sun's UV radiation is categorized by wavelength into UVA (400 nm to 320 nm), UVB (320 nm to 290 nm) and UVC (290 nm to 100 nm), based on its effect on the human skin. Whilst all wavelengths cause local heating, it is UVA that is responsible for skin ageing and UVB that is responsible for skin burning and non-melanoma skin cancer. UVC is largely filtered out by the earth's atmosphere. At low dose levels the damage to skin caused by UV is generally accepted to integrate over time, therefore the integrated dose must be measured over a period of sun exposure, and will account for time variations in the intensity due to for example cloud cover.

Existing solutions to monitoring the UV dose are available in the form of disposable patches which change color after a predetermined UV dose, bespoke monitoring units that are integrated into watches and wall-mounted weather station units that are used to monitor the UV dose in the user's back garden. However these all suffer from drawbacks. The disposable patches, whilst worn and therefore give a direct monitor of the dose, cannot be re-used and are therefore wasteful and require the user to carry an adequate supply. The sensors that are integrated into for example watches, require a dedicated photodetector and the corresponding filters in order to monitor the UV. The use of a dedicated photodetector in the sensing product increases cost and manufacturing complexity, and in some solutions requires a costly SiC or $TiO_2$ detector. The larger weather station wall-mounted units suffer from being bulky and are therefore non-portable.

Accordingly, a novel UV monitoring device without largely changing the existing processes is called for simplifying the manufacture and reducing the cost. In addition, this device should overcome the limitations of the related art, being incompatible with a portable unit, and eliminating the need for an expensive filter that is typically used in existing systems.

BRIEF SUMMARY OF THE INVENTION

The invention provides a portable UV monitoring device, comprising a standard display region, a reference region, and a UV sensitive region; wherein the device has a top substrate disposed between an array substrate and a fluorescent dye layer; and a plurality of photodetectors disposed on the top or bottom surface of the array substrate, or on the top or bottom surface of the top substrate, wherein the photodetectors corresponds to the reference region and the UV sensitive region, respectively, wherein the fluorescent dye layer corresponds to the UV sensitive region.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The essential issue that the invention aims to overcome is that of sensing the UVB component of the sun's radiation in a cost effective manner. Sunburn is largely caused by UVB radiation which is orders of magnitude more effective per unit dose at causing sunburn than UVA. The problem to be solved is that low cost light sensors are invariably made from silicon, and unless special processing is employed, standard silicon is sensitive to visible light but insensitive to UV. Whilst more expensive $TiO_2$ or silicon carbide (SiC) detectors are available which are insensitive to the visible and only see the UV, their processing is incompatible with that of active matrix liquid crystal displays (in abbreviate AMLCD). This problem is typically overcome by using a UV-sensitive fluorescent layer to convert the UV spectral component of the radiation to visible light, and then detecting this visible radiation using a low cost silicon detector. Herein lies the problem. The background radiation being monitored contains both UV and visible light, and the fluorescent layers that are used to convert the UV to the visible are typically partially transparent to visible light, which is of course also detected by the silicon detector and therefore gives an additional rogue signal. The solution typically employed demands an expensive optical filter prior to the UV-Visible fluorescent layer, which transmits only the UV component. In order to eliminate the need for this expensive visible-light-blocking filter, in this invention the visible light is allowed to be partially transmitted through the fluorescent layer, and the spectral content of the transmitted visible radiation plus the fluorescence-converted UV to visible radiation is then analyzed into its red, green, and blue components. The original intensity of UVA plus UVB is then determined by subtracting the corresponding components in the red, green, and blue from those that are detected in the absence of the fluorescent layer. The fluorescent layer is also responsive to UVC, but owing to ozone absorption this is only present in the background sunlight radiation at a very low intensity (it is strongly absorbed by the earth's atmosphere) and will not therefore interfere with the measurement. In order to detect only UVB (which is largely responsible for skin cancer), a further embodiment relies on the use of a low cost UVA-absorbing dye filter that is dispersed into the UV transmitting plastic casing of the display. The optical analysis is performed by the low cost RGB filters on an array substrate of a standard display which are located above identical silicon photodetectors. The manufacturing complexity is minimal because no special processes are necessary to fabricate the photodetectors on the display glass of a standard AMLCD array substrate in a portable product such as watch, mobile phone, MP3 player, or Sat Nav guidance system. Photodetectors are currently being integrated onto AMLCD array substrate in order to make Ambient Light Sensors (ALS) in many display products. Therefore, the invention provides a portable and personal UV monitoring system, increasing the functionality of an existing mobile display with minimal additional manufacturing complexity. Moreover, the AMLCD which incorporates the described UV monitoring system can be reflective LCD, transmissive LCD, or transflective LCD.

Alternatively, the display mode of the invention is not only the described liquid crystal display but also an organic light emitting diode (in abbreviate OLED).

Embodiments

Embodiment 1

Figure 1A:
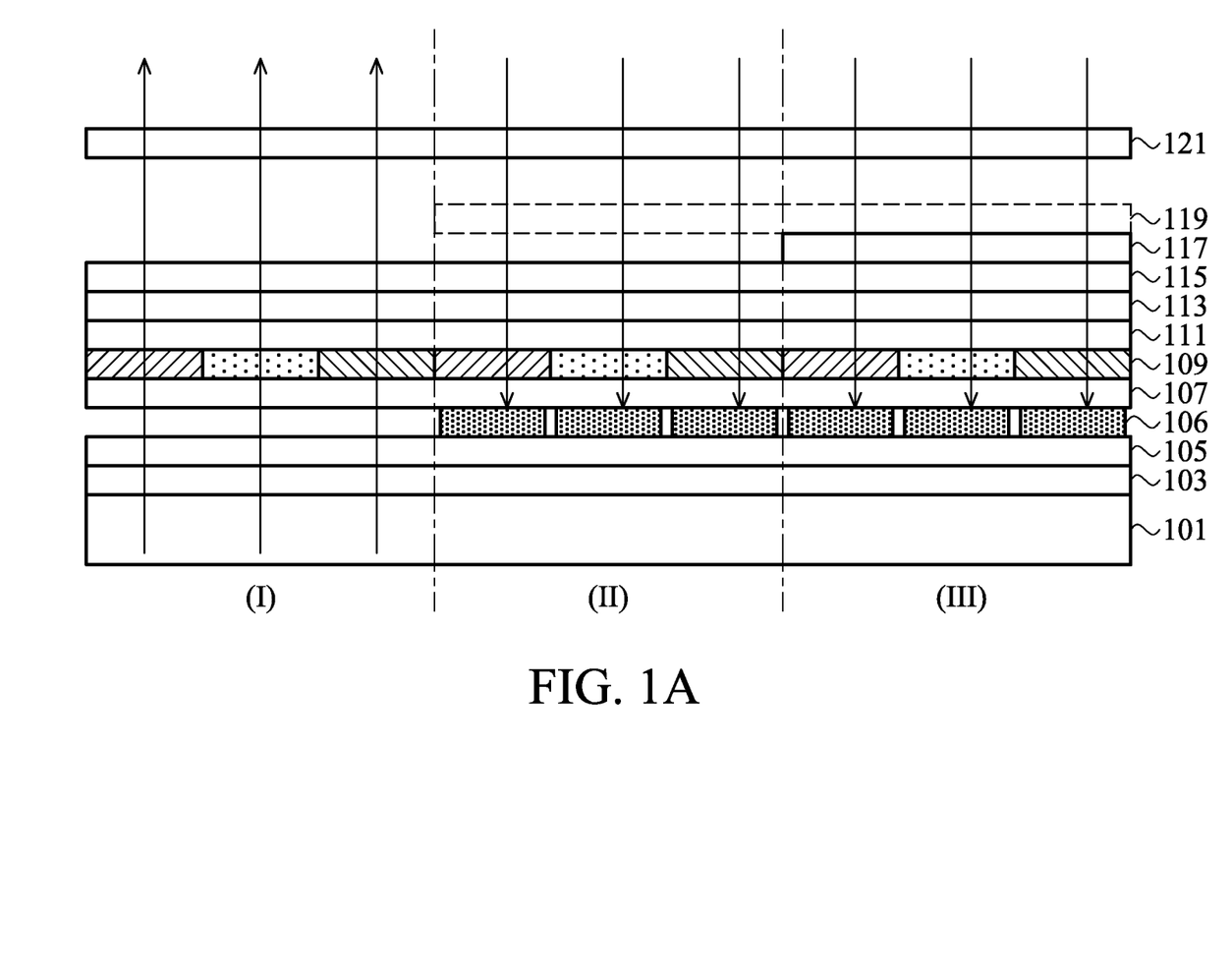
FIG. 1A is a cross sectional view showing a UV monitoring device.

The construction of a UV monitoring device is shown in FIG. 1A. The device of the FIG. 1A is subdivided into three regions in order to illustrate the differences from a standard mobile display construction. In the left third of FIG. 1A is the standard display region (I) in which light from the backlight 101 passes through the polarizer 103, through the array substrate 105 having a plurality of TFT arranged in array, has its intensity modulated by the liquid crystal layer 107, then passes through the color filter layer 109 on its top substrate 111 to generate the required intensity (the relative transmission of each RGB component within a pixel determining the net color and spectral content of the pixel), and finally passes through the compensation and bright enhancement films 113 and polarizer 115 where it is seen by the user.

Figure 2:
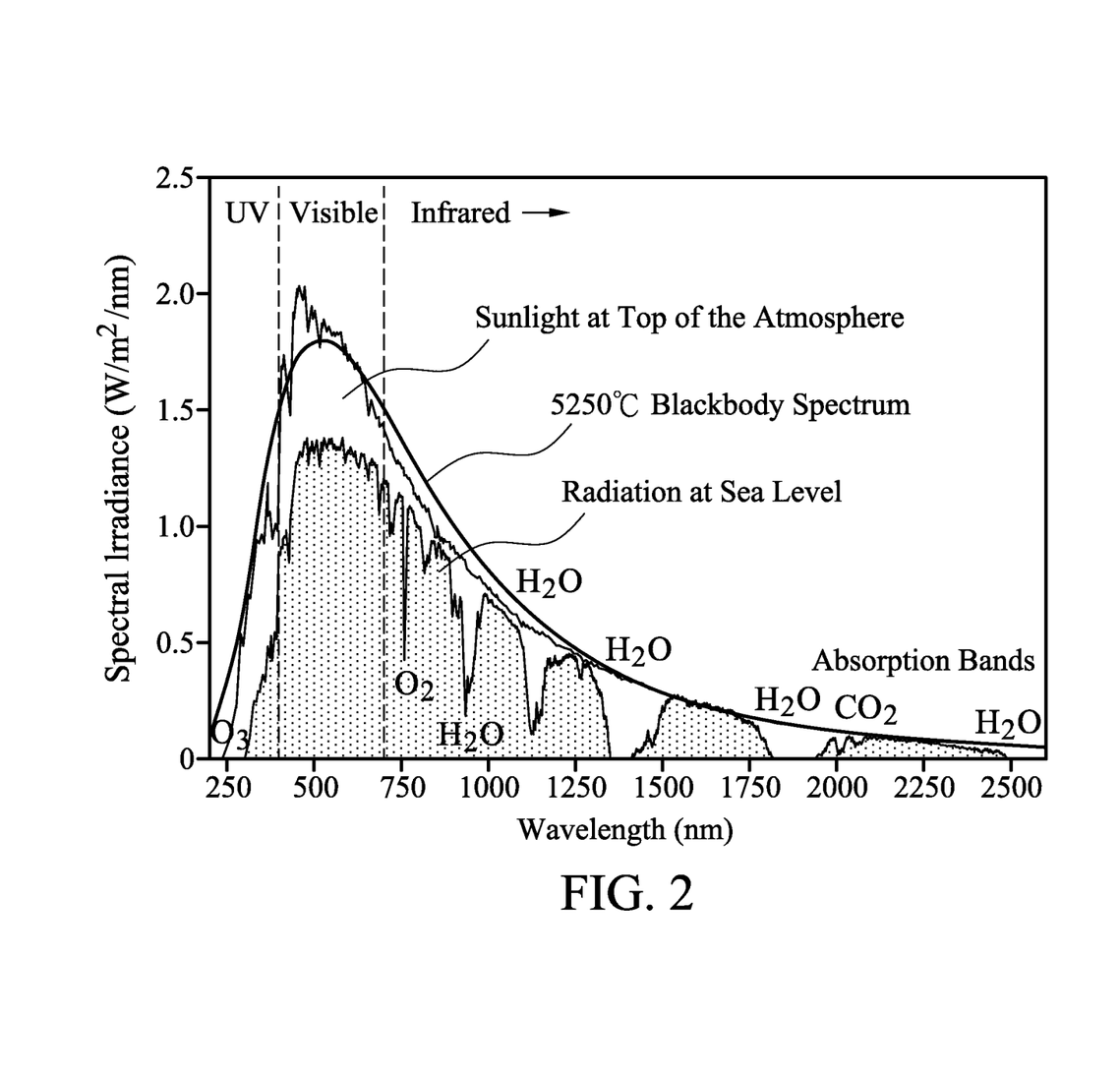
FIG. 2 shows spectral distribution of the background optical radiation.
Figure 3:
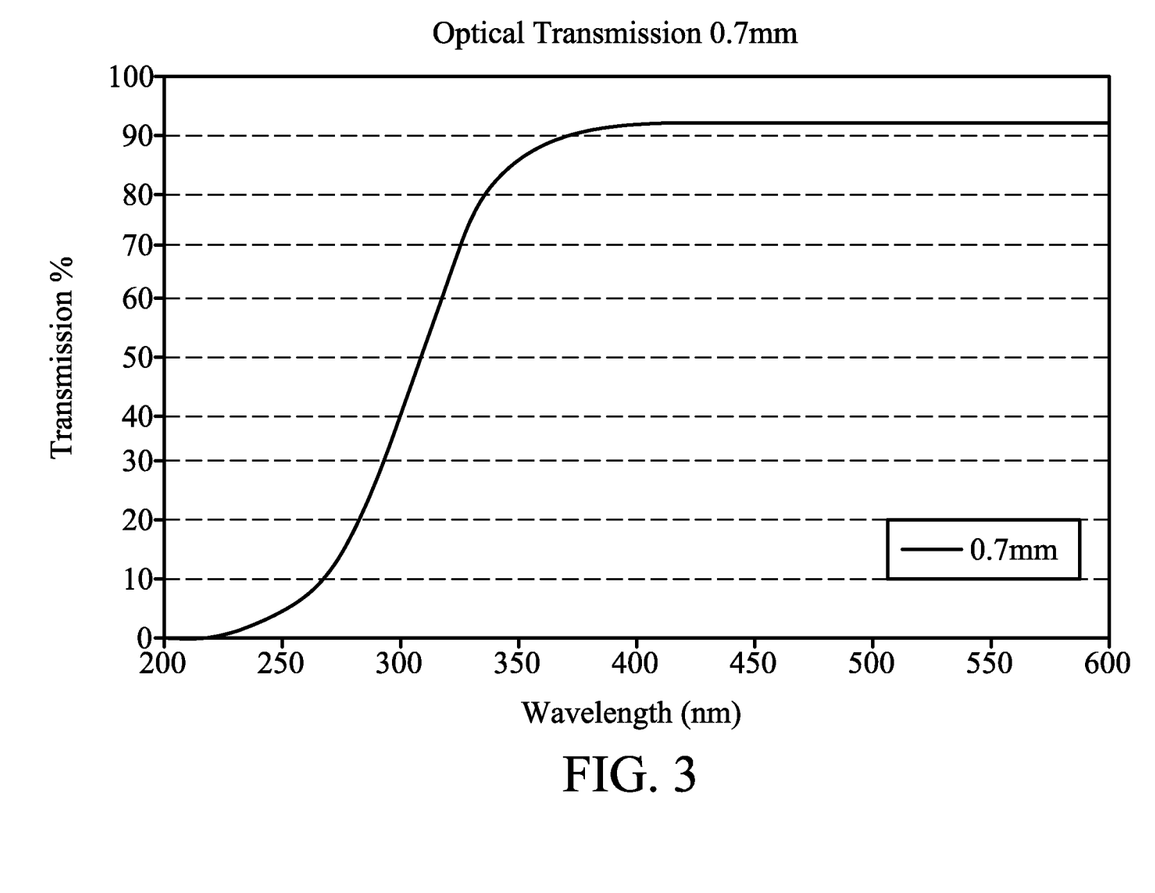
FIG. 3 shows transmission ratio versus different wavelengths of the commercial available glass sheet Corning's Eagle 2000 of 0.7 mm.

The reference region (II) is used to monitor the intensity of the red, green, and blue components of visible light in the background radiation. The silicon photodetectors in this region are of course only sensitive to the visible components of detected light. The R, G, and B intensities will then be subtracted from the corresponding detected intensities in the UV sensitive region (III). The background optical radiation has a spectral distribution as shown in FIG. 2. The regions of interest here are the visible and UV regions to the left of the FIG. 2. The infrared region in FIG. 2 shows the usual atmospheric gas absorption lines. The infrared is not of interest to the invention since the silicon detector will not detect wavelengths longer than 1100 nm. The UV region is subdivided into UVA (400 nm to 320 nm), UVB (320 nm to 290 nm) and UVC (290 nm to 100 nm), based on its effect on the human skin. As stated above, this embodiment aims to detect the combination of UVA plus UVB. As seen in FIG. 2, UVC has an almost-negligible contribution to the total UV signature as it is strongly absorbed by ozone in the earth's atmosphere and is therefore never detected by the detector. To eliminate the detection of UVC altogether, an additional glass sheet (not shown) is located between the optical radiation source and the fluorescent dye layer 117 in order to completely filter out the UVC component. The additional glass sheet can be Corning's Eagle 2000 having negligible UVC transmission as shown in FIG. 3.

Figure 1B:
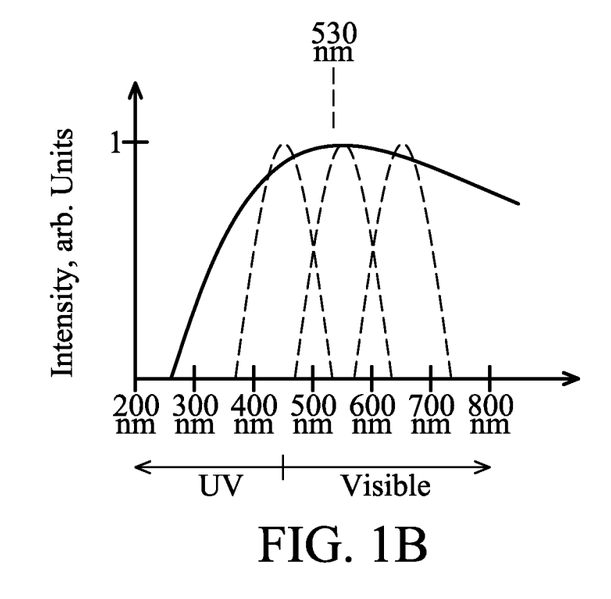
FIG. 1B shows optical spectra of the reference region of the device in FIG. 1A.
Figure 4:
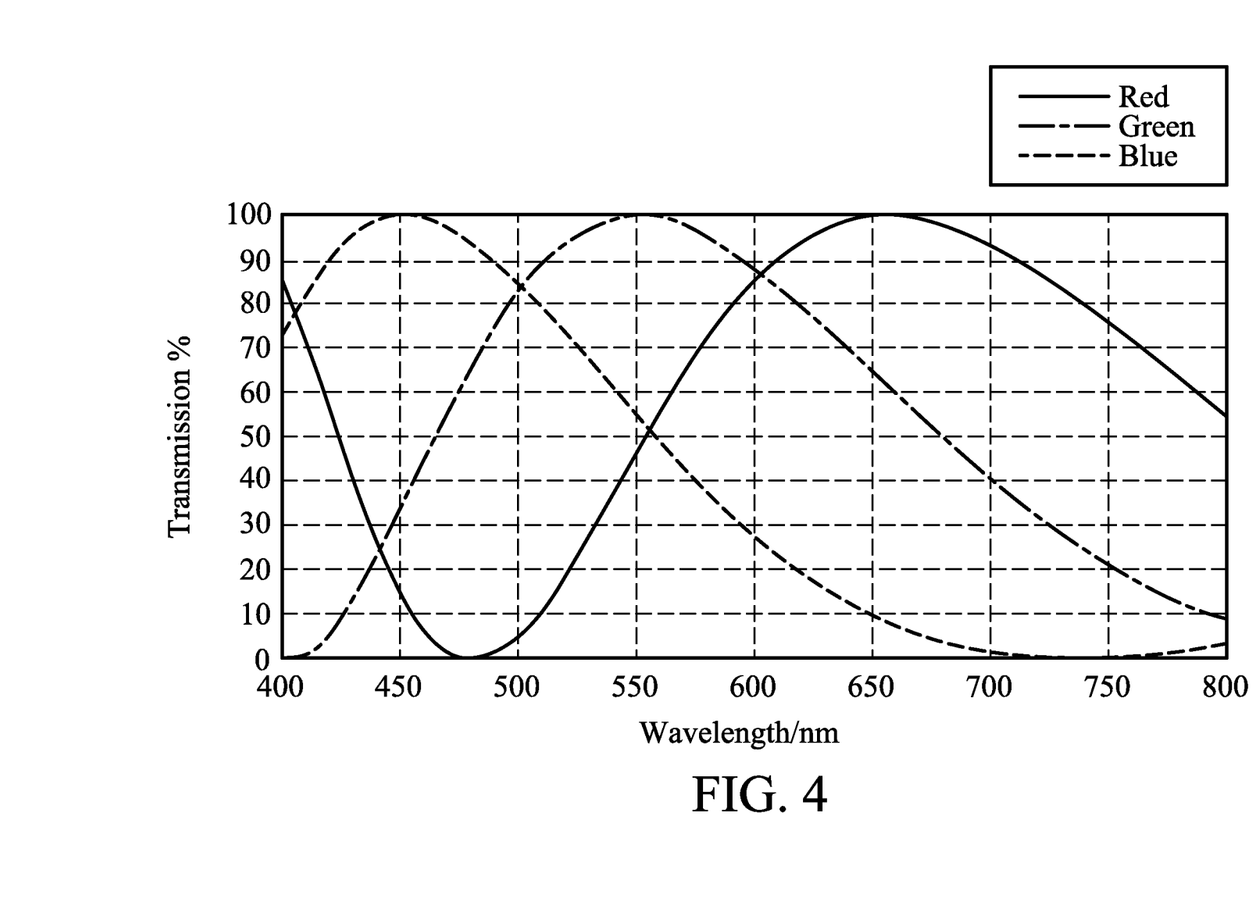
FIG. 4 shows transmission ratio versus different wavelengths of the color filters.

Returning to FIG. 1A, the Sun's solar spectrum initially passes through the UV transmitting plastic casing 121 that forms the existing protective cover of the mobile display. Different product manufacturers use different plastics for this layer, in which they currently care largely about the visible transmission. In the invention it is critical that this UV transmitting plastic casing 121 transmits visible light as well as both UVA and UVB. Some pure clear polymers (e.g. PMMA (poly(methyl methacrylate)), or Plexiglass) has sufficient UV transmission, but many manufacturers will use dyes dispersed in this UV transmitting plastic casing 121 for enhancing the UV absorption. This invention requires a UV-transmitting window between the background radiation source and the fluorescent dye layer in the UV sensing region (III), and the widow is made from, for example, Plexiglass. A thin polytetrafluoroethylene layer 119 passing all three wavelength regions, slightly attenuating the visible, and acting to scatter the incident radiation, can be optionally disposed between the UV transmitting plastic casing 121 and the fluorescent dye layer 117 to give the sensor a cosine response to incident radiation. Therefore, the visible plus UVA plus UVB optical radiations pass through the optional polytetrafluoroethylene layer. In the reference region (II), the relative components of the visible spectrum in red, green, and blue are then measured by the photodetectors 106 located on the array substrate 105 behind the color filters 109 after the light passes through the standard LCD layers such as polarizer 115, compensation and brightness enhancement films 113, and top substrate 111. The color filters 109 can be the standard color filter plate or the color filter on array (COA) used in general all full-color displays, and acts as optical filters in order to separate these three components of the visible spectrum. Whilst there is typically some overlap between the transmission spectra of these three phosphors as shown in FIG. 4, the separation of the visible light into these three components using the color filters 109 is sufficient for this invention. The photodetector 106 such as silicon photodiodes is readily implemented on the array substrate 105 in both amorphous and polysilicon with few process changes since these are currently being deployed as ambient light sensors in displays. Following their amplification and measurement using transimpedance or switched capacitor charge amplifiers (not shown and can be fabricated on the array substrate 105), the optical intensities from the photodetectors 106 in red, green, and blue pixels yield electrical signals (as shown in FIG. 1B) which correspond to the relative intensities of these three optical components in the visible spectrum. These signals measured in the reference region (II) are then subtracted from the signals measured in the UV sensitive region (III).

Figure 1C:
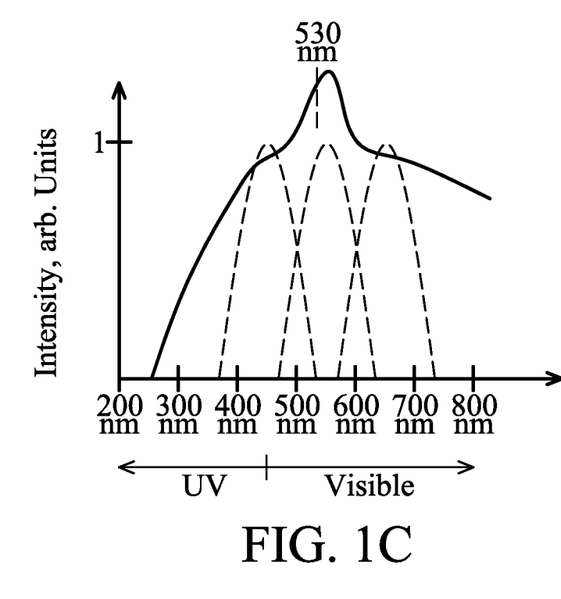
FIG. 1C shows optical spectra of the UV sensitive region of the device in FIG. 1A.
Figure 5:
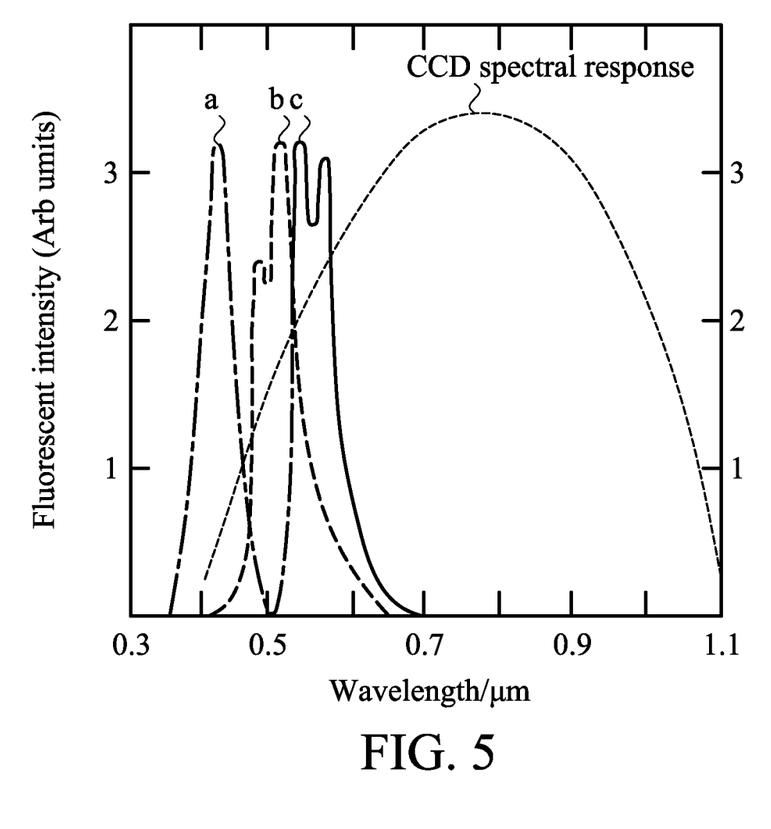
FIG. 5 shows fluorescent emission intensity as a function of a of wavelength of (a) sodium salicylate, (b) coronene, and (c) liumogen compared with the spectral response of a rear illuminated Si CCD.

The UV sensitive region (III) in the sensing system is identical to that of the reference region (II) except that it contained a fluorescent dye layer 117. After passes through the optional polytetrafluoroethylene layer 119, the visible plus UVA plus UVB optical radiations are incident upon the fluorescent dye layer 117, such that the UVA and UVB are converted to a visible radiation. Suitable dyes for the fluorescent dye layer 117 includes Liumogen and Coronene, whose fluorescence signatures and quantum efficiencies are shown in FIG. 5. Liumogen is the preferable dye of the invention, and is usually used in greenish fluorescent dye marker pens. Essentially, Liumogen has a flat quantum efficiency across the UV from 50 nm to 420 nm, so a photon anywhere in this wavelength region excited an electron-hole pair (and subsequently another photon in the visible) with the same probability. Coronene, with its emission spectrum centered at 520 nm is less attractive as it had a dip in its quantum efficiency between 390 and 420 nm which will complicate the detection process. As shown in FIG. 5, the Liumogen has a central emission wavelength of green light at 530 nm. However, Liumogen is partially transparent to visible light. The spectrum of the light transmitted by the fluorescent dye will therefore be visible light that is enhanced in the green region due to excitation of the phosphor by UVA plus UVB. This is a combination of the background visible light and the wavelength-converted UV radiation. The optical spectra of the light arriving at the phosphor layers prior to their detection into R, G and B are shown as dotted lines in FIG. 1C. In FIG. 1C, the transmission spectra of the phosphors are represented as dotted lines for clarity, showing that since the transmission of the green color filter is closely aligned with the emission of the fluorescent phosphor, good detection is achieved with this system. The greenish emission of the Liumogen fluorescent phosphor is clearly better aligned with that of the green color filter than that of Coronene.

In order to monitor the UV dose, the electrical signals corresponding to the red, green, and blue spectral from the UV sensitive region (III) as shown in FIG. 1C are subtracted from their corresponding red, green, and blue signals in the reference region (II) as shown in FIG. 1B by a subsequent electrical circuit of the array substrate 105. This result signal from the circuit is then transferred to the display region (I) array of the array substrate 105 for pointing out the UVA plus UVB content of the background radiation in order to advise the exposed sunbather. It can also subsequently be integrated over time in order to provide the user with the accumulated dose. Note that the photodetectors 106 in the reference region (II) and the UV sensitive region (III) are separated devices without contacting to each other. If the photodetectors 106 contact, the electrons should interference to each other.

Note that the polarizer 103 can be disposed between the color filters 109 and the liquid crystal layer 107 as well as between the fluorescent dye layer 117 and the top substrate 111 in FIG. 1A. This type is so-called in-cell polarizer. In addition, the photodetectors 106 can be formed on the top or bottom surface of the top substrate 111 or formed on the bottom surface of the array substrate 105 as well as on the top surface of the array substrate 105 in FIG. 1A.

Embodiment 2

Embodiment 2 incorporates a UVA filter (not shown) on the optical radiation side of the fluorescent dye layer 117. The filter selectively absorbs only the UVA radiation and therefore prevents it from contributing to the detected signals. Such dyes are available commercially and can be incorporated into various polymers such as Plexiglass and polycarbonate which is in widespread use in products such as sunglasses.

Embodiment 3

Figure 6:
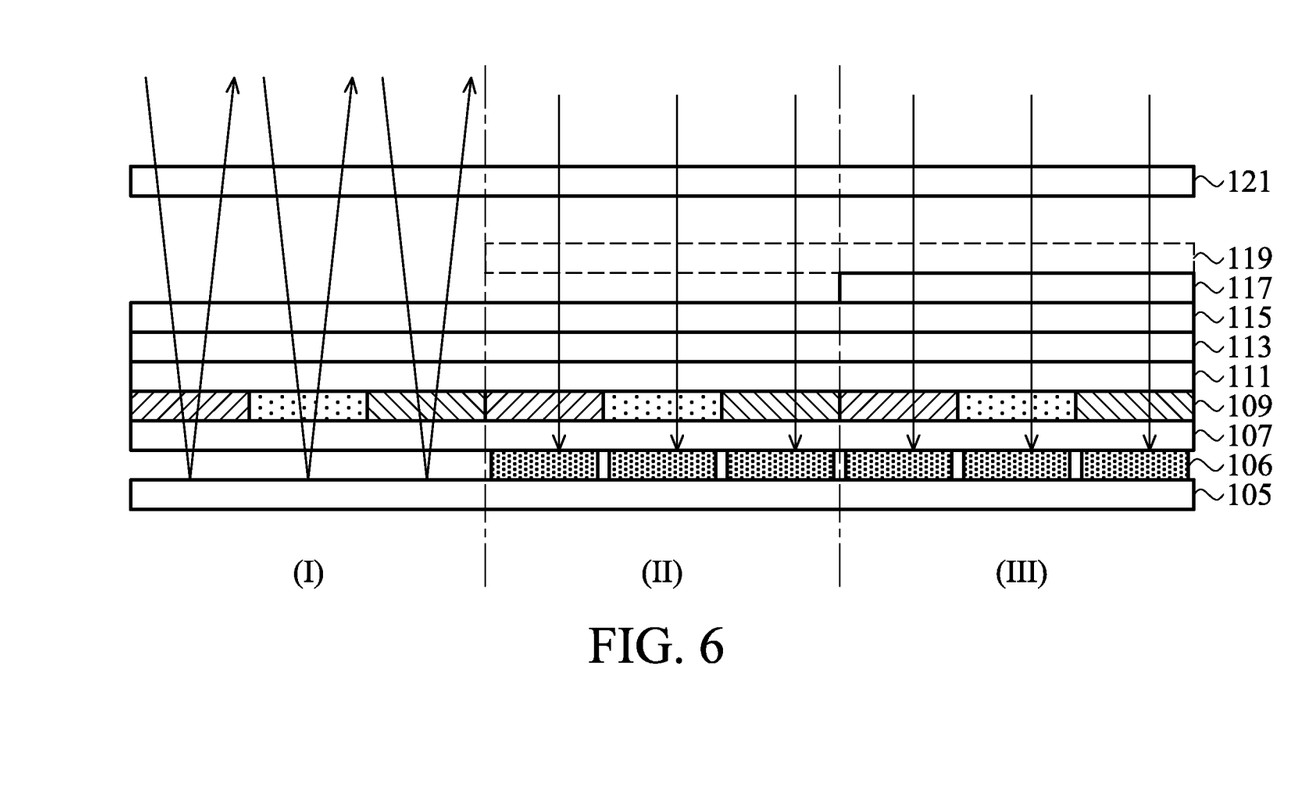
FIGS. 6-8 are cross sectional views showing UV monitoring devices.
Figure 7:
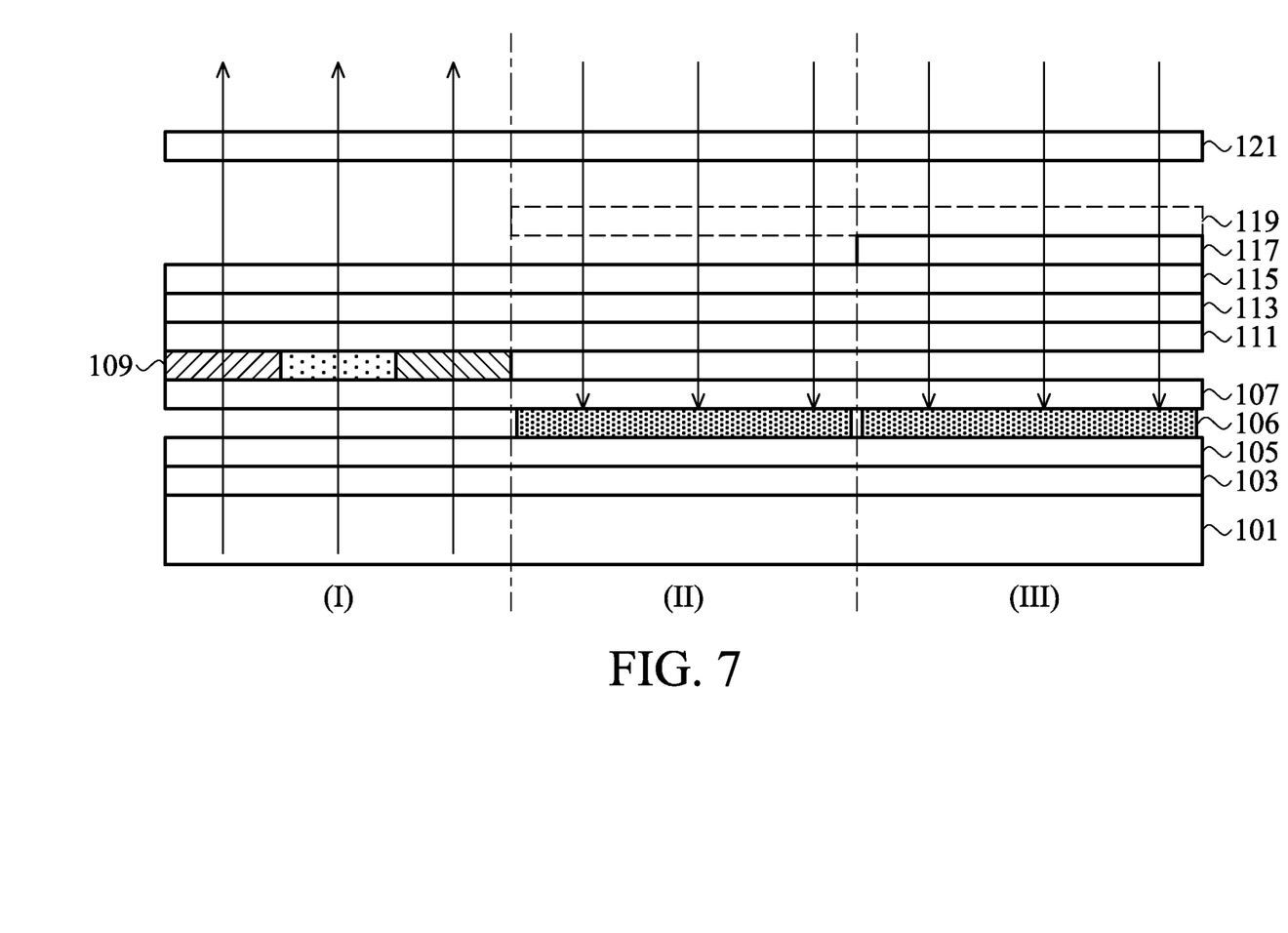

In Embodiment 1, the display mode of the display region (I) is transmissive or transflective type, and the pixel electrode of the array substrate 105 must be all transparent or semi-transparent to match the backlight. In Embodiment 3, the display mode of the display region (I) is reflective type, wherein the pixel electrode of the array substrate 105 is reflective material such as metal. As shown in FIG. 6, the backlight 101 and the polarizer 103 in FIG. 1A are omitted in Embodiment 3.

Embodiment 4

Figure 8:
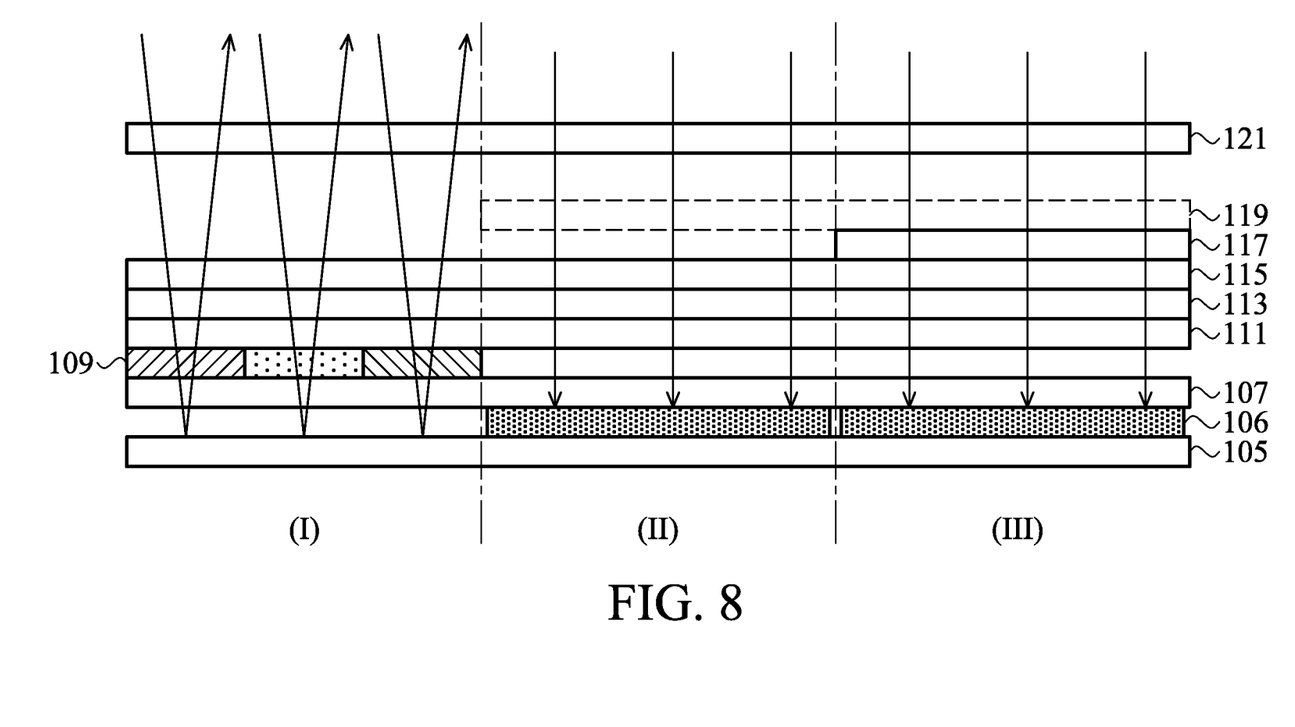

In Embodiment 4, the color filters in the reference region (II) and the UV sensitive region (III) are omitted. As such, the photodetector 106 in the reference region (II) will detect the visible light such as white light not divided into red, green, and blue light by the color filters. Moreover, the photodetector 106 in the UV sensitive region (III) will detect the visible light (white light) and the UV light (being transferred to visible light by the fluorescent dye layer 117). As described above, the signals of the reference region (II) and the UV sensitive region (III) can be calculated by the circuit of the array substrate 105. The result signal from the circuit is then transferred to the display region (I) array of the array substrate 105 for pointing out the UVA plus UVB content of the background radiation in order to advise the exposed sunbather. It can also subsequently be integrated over time in order to provide the user with the accumulated dose. Similarly, the UV monitoring device in this embodiment can be reflective type, such that the backlight 101 and the polarizer 103 can be omitted as shown in FIG. 8.

Embodiment 5

Figure 9A:
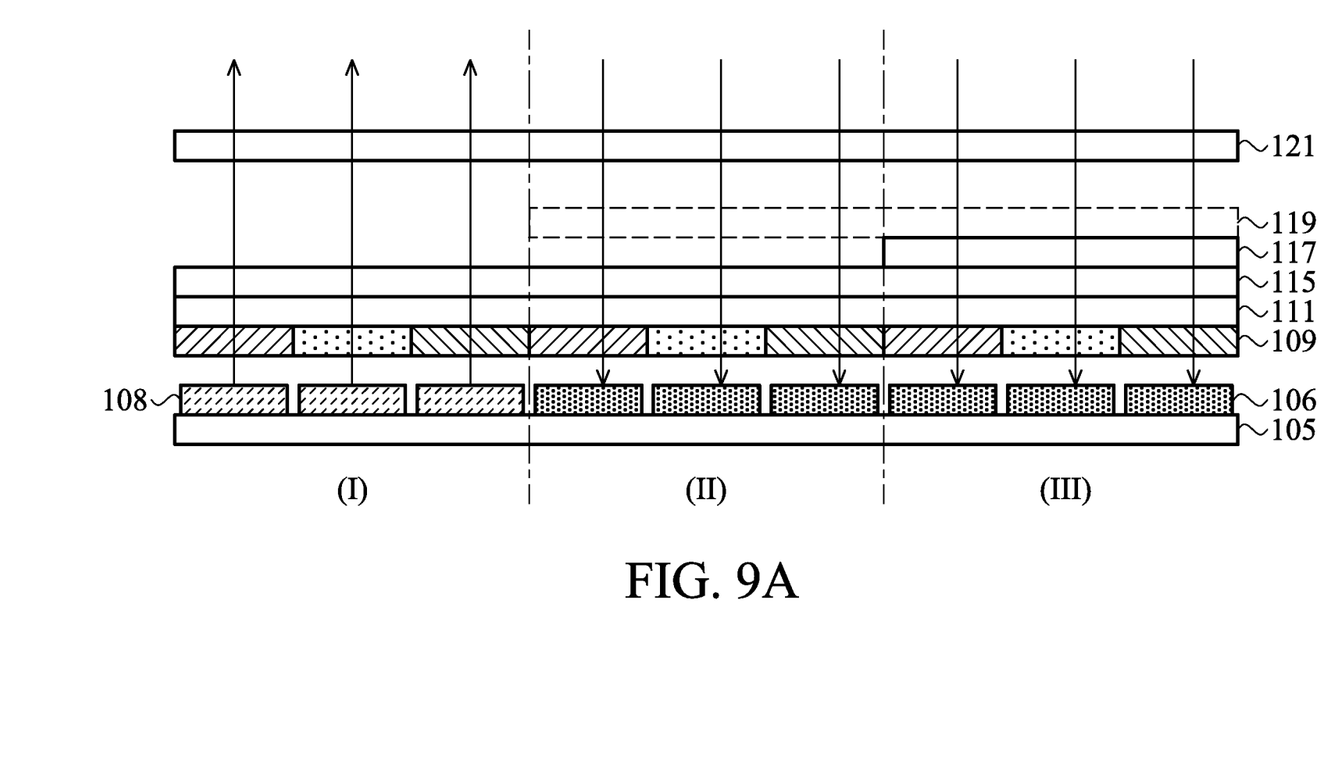
FIGS. 9A-9D are cross sectional views showing a UV monitoring devices.

In Embodiments 1-4, the display mode is LCD and therefore needing liquid crystal layer 107. In Embodiment 5, the display mode is replaced to OLED, such that the crystal layer 107 can be omitted. Moreover, the OLED display does not need the back light unit 101, the polarizer 103, and compensation and bright enhancement films 113. The other layers/elements such as array substrate 105, photodetectors 106, top substrate 111, fluorescent dye layer 117, optional polarizer 115, thin polytetrafluoroethylene layer 119, and UV transmitting plastic casing 121 are similar to that of the LCD mode as described in Embodiment 1. As shown in FIG. 9A, the OLED stack 108, sequentially formed of an anode, a hole transfer layer, an illumination layer, an electron transfer layer, a cathode, and the likes, is formed on the array substrate 105, wherein the OLED stack 108 corresponds to the standard display region (I). In FIG. 9A, the OLED stack 108 illuminates white light, such that the color filter layer 109 is adopted to display full color image.

Embodiment 6

Figure 9B:
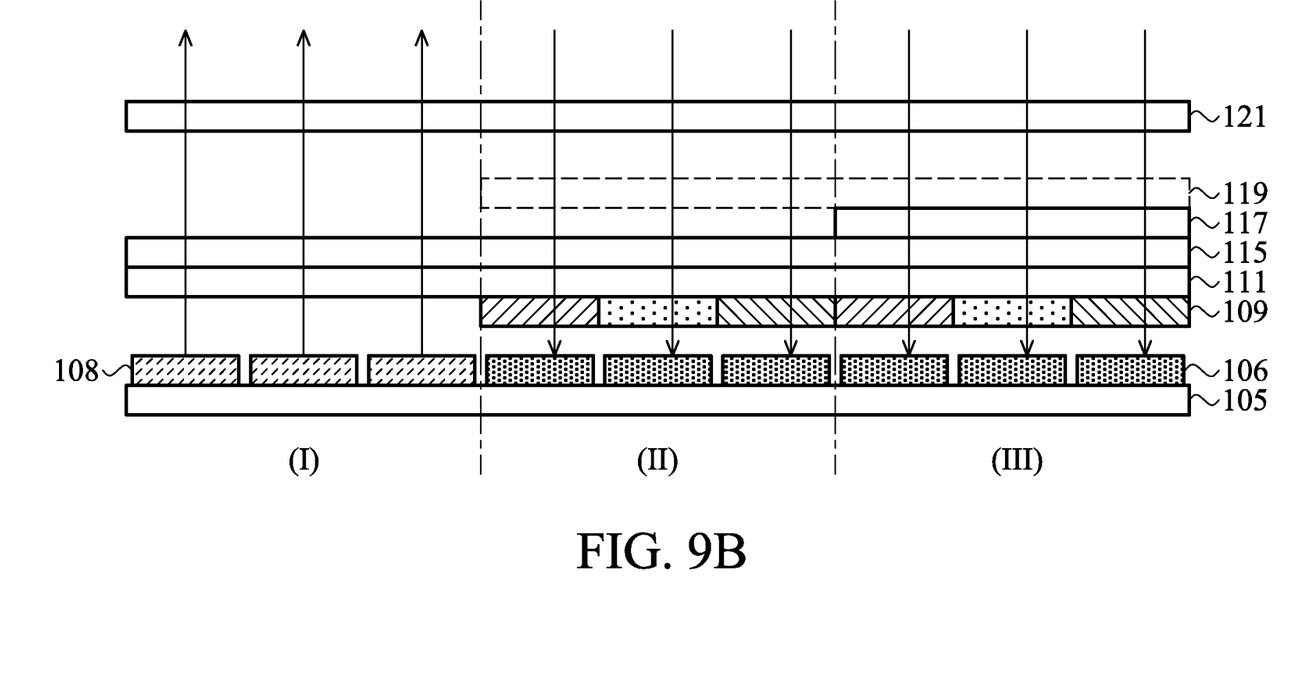

In embodiment 5, the OLED stack 108 illuminates white light and therefore needing color filter layer 109. In Embodiment 6, the OLED stack 108 arranged as pixels illuminates red, green, and blue lights, respectively. As shown in FIG. 9B, the standard display region (I) of the device in Embodiment 6 is free of the color filter layer 109.

Embodiment 7

Figure 9C:
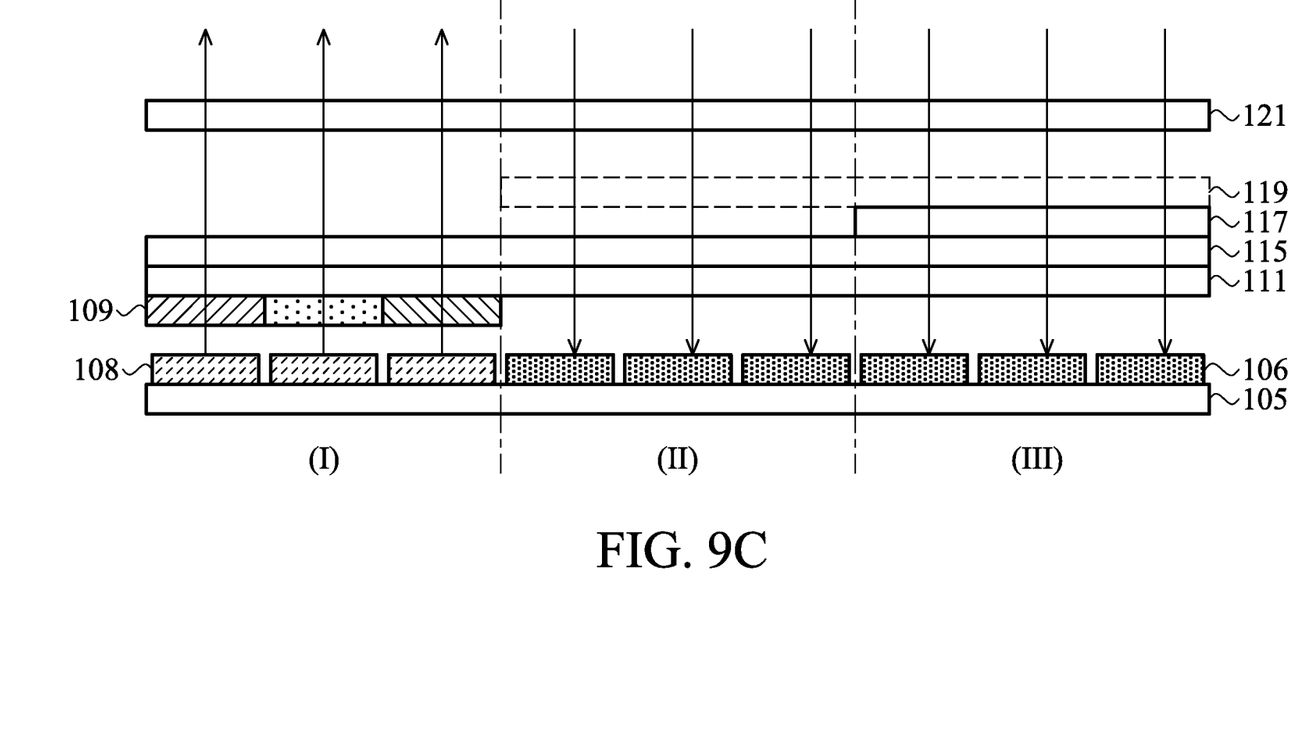

The device in Embodiment 7 is similar to Embodiment 5, the only difference in Embodiment 7 is the color filter layer 109 in the reference region (II) and the UV sensitive region (III) are omitted. As shown in FIG. 9C, the photodetector 106 in the reference region (II) will detect the visible light such as white light not divided into red, green, and blue light by the color filters. Moreover, the photodetector 106 in the UV sensitive region (III) will detect the visible light (white light) and the UV light (being transferred to visible light by the fluorescent dye layer 117). As described above, the signals of the reference region (II) and the UV sensitive region (III) can be calculated by the circuit of the array substrate 105. The result signal from the circuit is then transferred to the display region (I) array of the array substrate 105 for pointing out the UVA plus UVB content of the background radiation in order to advise the exposed sunbather.

Embodiment 8

Figure 9D:
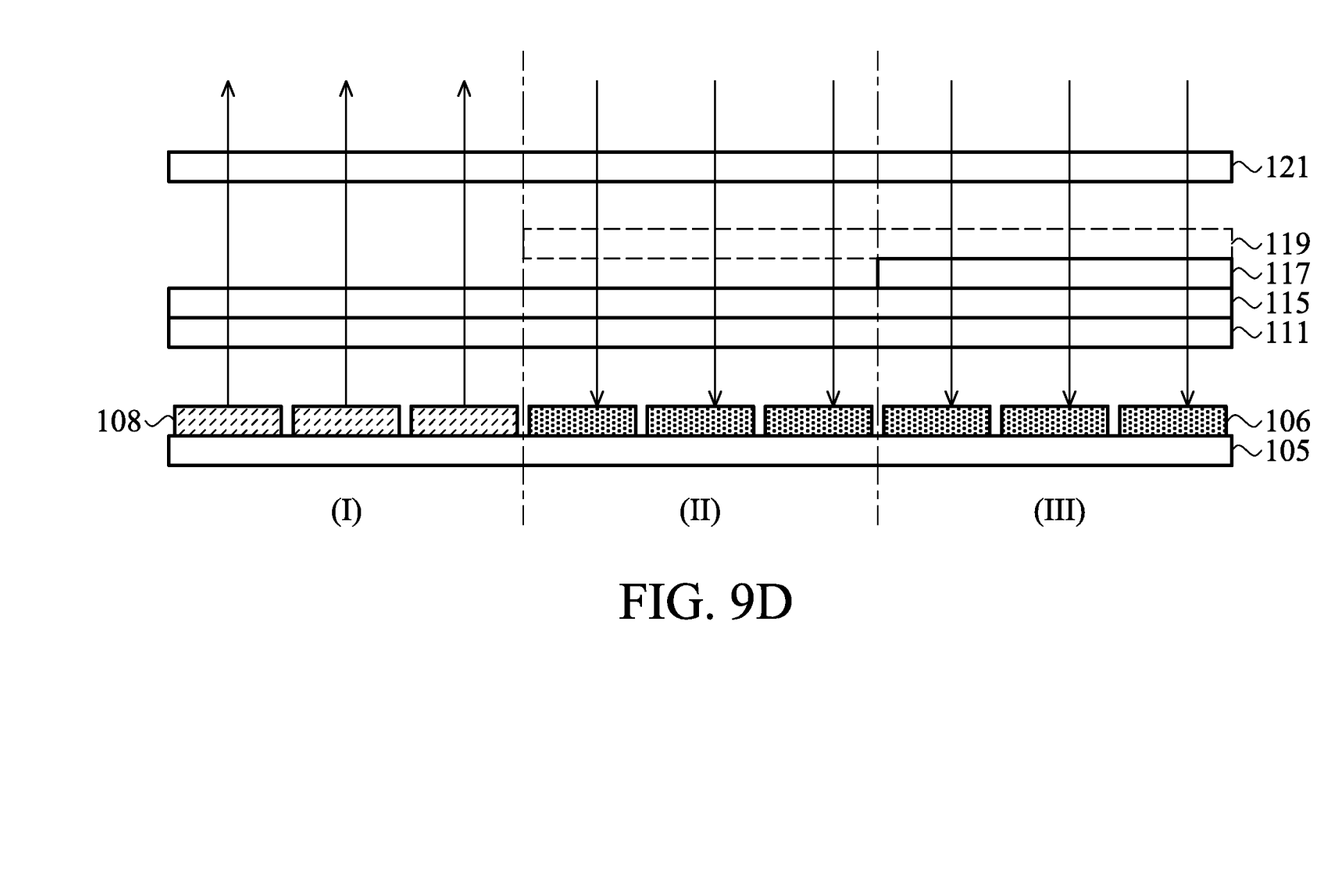

The device in Embodiment 8 is similar to Embodiment 6, the only difference in Embodiment 8 is the color filter layer 109 in the reference region (II) and the UV sensitive region (III) are omitted too. As shown in FIG. 9D, the photodetector 106 in the reference region (II) will detect the visible light such as white light not divided into red, green, and blue light by the color filters. Moreover, the photodetector 106 in the UV sensitive region (III) will detect the visible light (white light) and the UV light (being transferred to visible light by the fluorescent dye layer 117). As described above, the signals of the reference region (II) and the UV sensitive region (III) can be calculated by the circuit of the array substrate 105. The result signal from the circuit is then transferred to the display region (I) array of the array substrate 105 for pointing out the UVA plus UVB content of the background radiation in order to advise the exposed sunbather.

Note that the photodetectors 106 can be formed on the top or bottom surface of the top substrate 111 or on the bottom surface of the array substrate 105 as well as on the top surface of the array substrate 105 in FIG. 9A-9D.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A portable UV monitoring device, comprising:
a standard display region, a reference region, and a UV sensitive region;
wherein the device has:
a top substrate disposed between an array substrate and a fluorescent dye layer;
a plurality of photodetectors disposed on the top or bottom surface of the array substrate, or on the top or bottom surface of the top substrate, wherein the photodetectors corresponds to the reference region and the UV sensitive region, respectively;
a liquid crystal layer disposed between the array substrate and the top substrate; and
a color filter layer disposed between the liquid crystal layer and the top substrate,
wherein the color filter layer corresponds to the standard display region,
wherein the fluorescent dye layer corresponds to the UV sensitive region, and
wherein the color filter layer further corresponds to the reference region and the UV sensitive region.

2. The device as claimed in claim 1, further comprising a polarizer disposed between the fluorescent dye layer and the top substrate, or between the color filter layer and the liquid crystal layer.

3. The device as claimed in claim 2, further comprising a compensation and brightness enhancement film disposed between the polarizer and the top substrate.

4. The device as claimed in claim 1, wherein the array substrate has a reflective array.

5. The device as claimed in claim 1, further comprising a polytetrafluoroethylene layer disposed on the fluorescent dye layer, wherein the polytetrafluoroethylene layer corresponds to the reference region and the UV sensitive region.

6. The device as claimed in claim 1, further comprising a UVA filter disposed on the fluorescent dye layer, wherein the UVA filter corresponds to the UV sensitive region.

7. The device as claimed in claim 1, wherein the device is a watch, a mobile phone, a media player, or a satellite navigator guidance.

8. A portable UV monitoring device, comprising:
a standard display region, a reference region, and a UV sensitive region;
wherein the device has:
a top substrate disposed between an array substrate and a fluorescent dye layer;
a plurality of photodetectors disposed on the top or bottom surface of the array substrate, or on the top or bottom surface of the top substrate, wherein the photodetectors corresponds to the reference region and the UV sensitive region, respectively; and
a UV transmitting plastic casing disposed on the fluorescent dye layer,
wherein the fluorescent dye layer corresponds to the UV sensitive region.

9. The device as claimed in claim 8, further comprising a UVB absorbing dye dispersed in the UV transmitting plastic casing.

10. The device as claimed in claim 8, further comprising an OLED stack disposed between the array substrate and the top substrate, wherein the OLED stack corresponds to the standard display region.

11. The device as claimed in claim 8, further comprising a liquid crystal layer disposed between the array substrate and the top substrate.

12. The device as claimed in claim 11, further comprising a color filter layer disposed between the liquid crystal layer and the top substrate, wherein the color filter layer corresponds to the standard display region.

13. The device as claimed in claim 12, wherein the color filter layer further corresponds to the reference region and the UV sensitive region.

14. The device as claimed in claim 12, further comprising a polarizer disposed between the fluorescent dye layer and the top substrate, or between the color filter layer and the liquid crystal layer.

15. The device as claimed in claim 14, further comprising a compensation and brightness enhancement film disposed between the polarizer and the top substrate.

16. The device as claimed in claim 8, wherein the array substrate has a reflective array, a transflective array, or a transmissive array.

17. The device as claimed in claim 8, further comprising a polytetrafluoroethylene layer disposed on the fluorescent dye layer, wherein the polytetrafluoroethylene layer corresponds to the reference region and the UV sensitive region.

18. The device as claimed in claim 8, further comprising a UVA filter disposed on the fluorescent dye layer, wherein the UVA filter corresponds to the UV sensitive region.

19. The device as claimed in claim 8, wherein the device is a watch, a mobile phone, a media player, or a satellite navigator guidance.

\* \* \* \* \*